(12) United States Patent
Wu et al.

(10) Patent No.: US 12,191,251 B2
(45) Date of Patent: *Jan. 7, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chien-Hsun Chen, Zhutian Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,843

(22) Filed: Jun. 14, 2023

(65) Prior Publication Data
US 2023/0326850 A1 Oct. 12, 2023

Related U.S. Application Data

(63) Continuation of application No. 17/222,225, filed on Apr. 5, 2021, now Pat. No. 11,715,686, which is a (Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76898* (2013.01); *H01L 23/481* (2013.01); (Continued)

(58) Field of Classification Search
CPC ........... H01L 23/5226; H01L 21/76898; H01L 23/481; H01L 23/5283; H01L 24/09; (Continued)

(56) References Cited

U.S. PATENT DOCUMENTS 10,971,446 B2 * 4/2021 Wu .......................... H01L 24/09
11,715,686 B2 * 8/2023 Wu .......................... H01L 24/09
257/690

(Continued)

FOREIGN PATENT DOCUMENTS

CN 107665887 A 2/2018
KR 20140000608 A 1/2014
(Continued)

*Primary Examiner* — Tong-Ho Kim
(74) *Attorney, Agent, or Firm* — Slater Matsil, LLP

(57) ABSTRACT

A method includes forming a redistribution structure on a carrier, attaching an integrated passive device on a first side of the redistribution structure, attaching an interconnect structure to the first side of the redistribution structure, the integrated passive device interposed between the redistribution structure and the interconnect structure, depositing an underfill material between the interconnect structure and the redistribution structure, and attaching a semiconductor device on a second side of the redistribution structure that is opposite the first side of the redistribution structure.

20 Claims, 12 Drawing Sheets

Related U.S. Application Data continuation of application No. 16/458,374, filed on Jul. 1, 2019, now Pat. No. 10,971,446.

(60) Provisional application No. 62/774,119, filed on Nov. 30, 2018.

(51) Int. Cl.
*H01L 23/00* (2006.01)
*H01L 23/48* (2006.01)
*H01L 23/528* (2006.01)
*H01L 25/16* (2023.01)

(52) U.S. Cl.
CPC .......... *H01L 23/5283* (2013.01); *H01L 24/09* (2013.01); *H01L 24/17* (2013.01); *H01L 24/97* (2013.01); *H01L 25/16* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01)

(58) Field of Classification Search
CPC ......... H01L 24/17; H01L 24/97; H01L 25/16; H01L 2224/0231; H01L 2224/02373; H01L 2224/02379; H01L 2224/02381; H01L 2224/0401; H01L 23/49822; H01L 23/49827; H01L 23/5383; H01L 24/16; H01L 24/32; H01L 24/73; H01L 24/81; H01L 24/92; H01L 25/0652; H01L 2224/16145; H01L 2224/16227; H01L 2224/17181; H01L 2224/32225; H01L 2224/73204; H01L 2224/81203; H01L 2224/81815; H01L 2224/92125; H01L 2225/06513; H01L 2225/06517; H01L 2924/15192; H01L 2924/15311; H01L 2924/18161; H01L 2924/19011; H01L 2924/19041; H01L 2924/19042; H01L 2924/19043; H01L 23/5385; H01L 21/568; H01L 21/6835; H01L 23/3128; H01L 23/49816; H01L 23/5384; H01L 2221/68345; H01L 21/56; H01L 23/31; H01L 24/02; H01L 21/027; H01L 21/52; H01L 21/563; H01L 21/768; H01L 23/485; H01L 24/11; H01L 24/12; H01L 24/19; H01L 24/20; H01L 25/073; H05K 3/4602; H05K 3/4614; H05K 2203/061; H05K 2201/09536
USPC ........................................................ 257/690
See application file for complete search history.

(56) References Cited

U.S. PATENT DOCUMENTS

| | | | |
|---|---|---|---|
| 2013/0341786 | A1* | 12/2013 | Hsu .................. H01L 23/49811 257/737 |
| 2015/0102505 | A1 | 4/2015 | Chung et al. |
| 2016/0086930 | A1 | 3/2016 | Koey et al. |
| 2016/0118297 | A1 | 4/2016 | Chen et al. |
| 2016/0118333 | A1 | 4/2016 | Lin |
| 2019/0131273 | A1* | 5/2019 | Chen ....................... H01L 24/19 |

FOREIGN PATENT DOCUMENTS

| | | |
|---|---|---|
| KR | 20150044263 A | 4/2015 |
| KR | 20160029621 A | 3/2016 |
| TW | 201917847 A | 5/2019 |

\* cited by examiner

SEMICONDUCTOR DEVICE AND METHOD OF MANUFACTURE

PRIORITY CLAIM AND CROSS-REFERENCE

This application is a continuation of U.S. patent application Ser. No. 17/222,225 filed Apr. 5, 2021, now U.S. Pat. No. 11,715,686, issued Aug. 1, 2023, entitled "Semiconductor Device and Method of Manufacture," which is a continuation of U.S. patent application Ser. No. 16/458,374 filed Jul. 1, 2019, entitled "Semiconductor Device and Method of Manufacture," now U.S. Pat. No. 10,971,446, issued Apr. 6, 2021, which claims priority to U.S. Provisional Patent Application No. 62/774,119 filed Nov. 30, 2018, entitled "Semiconductor Device and Method of Manufacture," each application is hereby incorporated by reference in its entirety.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
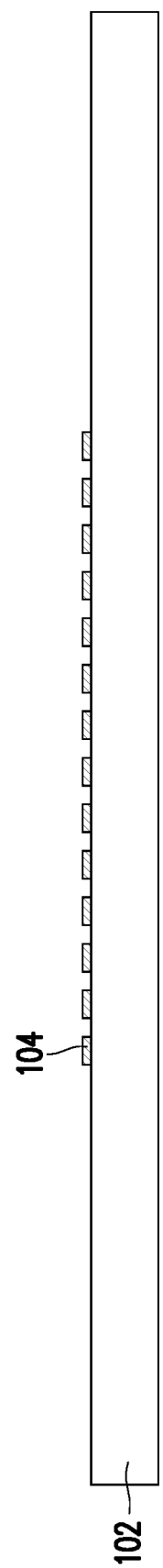
FIGS. 1-4 illustrate cross-sectional views of intermediate steps of forming a device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a system-in-package. In some embodiments, a redistribution structure may be formed over a carrier substrate, and then an integrated passive device attached to the redistribution structure. The redistribution structures may be, for example, fan-out structures. An interconnect structure is formed on a core substrate and then attached to the redistribution structure with the integrated passive device disposed between the interconnect structure and the redistribution structure. A semiconductor device is then attached to the redistribution structure. By locating the integrated passive device between the redistribution structures and the interconnect structure, the distance between the semiconductor device and the integrated passive device may be reduced and the electrical performance of the package may be improved.

FIGS. 1 through 11 illustrate cross-sectional views of intermediate steps of forming a package 600 (see Figure ii), in accordance with some embodiments. FIGS. 1 through 4 illustrate cross-sectional views of intermediate steps of forming a device structure 200 (see FIG. 4), in accordance with some embodiments. FIGS. 5A through 5C illustrate cross-sectional views of intermediate steps of forming interconnect structure 300, in accordance with some embodiments. FIGS. 6-11 illustrate cross-sectional views of intermediate steps of forming a package 600, in accordance with some embodiments.

With reference now to FIG. 1, there is shown a carrier substrate 102 on which contact pads 104 have been formed, in accordance with some embodiments. The carrier substrate 102 may include, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material or an organic material, and which may have a rectangular shape. The carrier substrate 102 may be planar in order to accommodate the formation of additional features, such as the contact pads 104.

In some embodiments, a release layer (not shown) may be formed on the top surface of the carrier substrate 102 to facilitate subsequent debonding of the carrier substrate 102.

The release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 102, or the like. The top surface of the release layer may be leveled and may have a high degree of co-planarity.

In an embodiment, the contact pads 104 may be formed by initially forming a seed layer (not shown) of one or more layers of titanium, copper, or a titanium-copper alloy using a suitable formation process such as PVD, CVD, sputtering, or the like. The seed layer is formed over the carrier substrate 102 or a release layer, if present. A photoresist (also not shown) may then be formed to cover the seed layer and then be patterned to expose those portions of the seed layer that are located where the contact pads 104 will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating or electroless plating, or the like. However, while the material and methods discussed are suitable to form the conductive material, these are merely examples. Any other suitable materials or any other suitable processes of formation, such as CVD or PVD, may alternatively be used to form the contact pads 104. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the contact pads 104.

Figure 2:
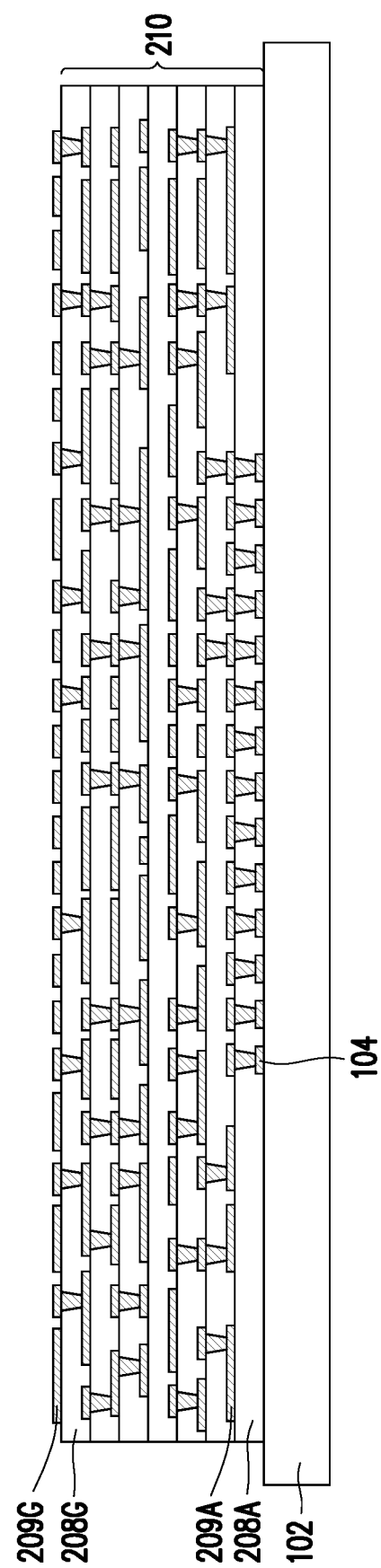

Turning to FIG. 2, a redistribution structure 210 is formed over the contact pads 104 and the carrier substrate 102, in accordance with some embodiments. The redistribution structure 210 shown includes insulating layers 208A-G (for clarity, only insulating layers 208A and 208G are labeled) and includes redistribution layers 209A-G (for clarity, only redistribution layers 209A and 209G are labeled). In other embodiments, different numbers of insulating layers or redistribution layers may be formed in the redistribution structure 210 than described herein. In some embodiments, the redistribution structure 210 may be formed in a different process than that described herein. In some embodiments, the redistribution structure 210 may be, for example, a fan-out structure. In some embodiments, the redistribution structure 210 may have a thickness between about 20 μm and about 1000 μm.

Still referring to FIG. 2, the insulating layer 208A is formed over the contact pads 104 and the carrier substrate 102. The insulating layer 208A may be made of one or more suitable dielectric materials such as an oxide (e.g., silicon oxide), a nitride (e.g., silicon nitride), a polymer material (e.g., a photosensitive polymer material), a polyimide material, a low-k dielectric material, another dielectric material, the like, or a combination thereof. The insulating layer 208A may be formed by a process such as spin-coating, lamination, CVD, the like, or a combination thereof. The insulating layer 208A may have a thickness of between about 2 μm and about 50 μm, such as about 15 μm, although any suitable thickness may be used. Openings into the insulating layer 208A may be formed using a suitable photolithographic mask and etching process. For example, a photoresist may be formed and patterned over the insulating layer 208A, and one or more etching processes (e.g., a wet etching process or a dry etching process) are utilized to remove portions of the insulating layer 208A. In some embodiments, the insulating layer 208A is formed of a photosensitive polymer such as PBO, polyimide, BCB, or the like, in which openings may be patterned directly using a photolithographic mask and etching process. The openings in the insulating layer 208A may expose the contact pads 104.

The redistribution layer 209A may then be formed to provide additional routing along with electrical connection within the redistribution structure 210. In an embodiment, the redistribution layer 209A may be formed using materials and processes similar to the contact pads 104. For example, a seed layer may be formed, a photoresist placed and patterned on top of the seed layer in a desired pattern for the redistribution layer 209A. Conductive material (e.g., copper, titanium, or the like) may then be formed in the patterned openings of the photoresist using e.g., a plating process. The photoresist may then be removed and the seed layer etched, forming redistribution layer 209A. In this manner, the redistribution layer 209A may form electrical connections to the contact pads 104.

Additional insulating layers 208B-G and redistribution layers 209B-G may then be formed over the redistribution layer 209A and insulating layer 208A to provide additional routing along with electrical connection within the redistribution structure 210. The insulating layers 208B-G and redistribution layers 209B-G may be formed in alternating layers, and may be formed using processes and materials similar to those used for the insulating layer 208A or the redistribution layer 209A. For example, an insulating layer (e.g., insulating layer 208B) may be formed over a redistribution layer (e.g., redistribution layer 209A), and then openings made through the insulating layer to expose portions of the underlying redistribution layer using a suitable photolithographic mask and etching process. A seed layer may be formed over the insulating layer and conductive material formed on portions of the seed layer, forming an overlying redistribution layer (e.g., redistribution layer 209B). These steps may be repeated to form a redistribution structure 210 having a suitable number and configuration of insulation layers and redistribution layers. Alternatively, the insulating layer 208B-G or redistribution layers 209B-G may be formed differently than the insulating layer 208A or redistribution layer 209A. The insulating layers 208B-G may be formed to each have a thickness of between about 2 μm and about 50 μm, such as about 15 μm. In this manner, the redistribution structure 210 may be formed that is electrically connected to the contact pads 104. In some embodiments, the redistribution structure 210 is a fan-out structure. In other embodiments, the second redistribution structure 210 may be formed in a different process than described herein.

Figure 3:
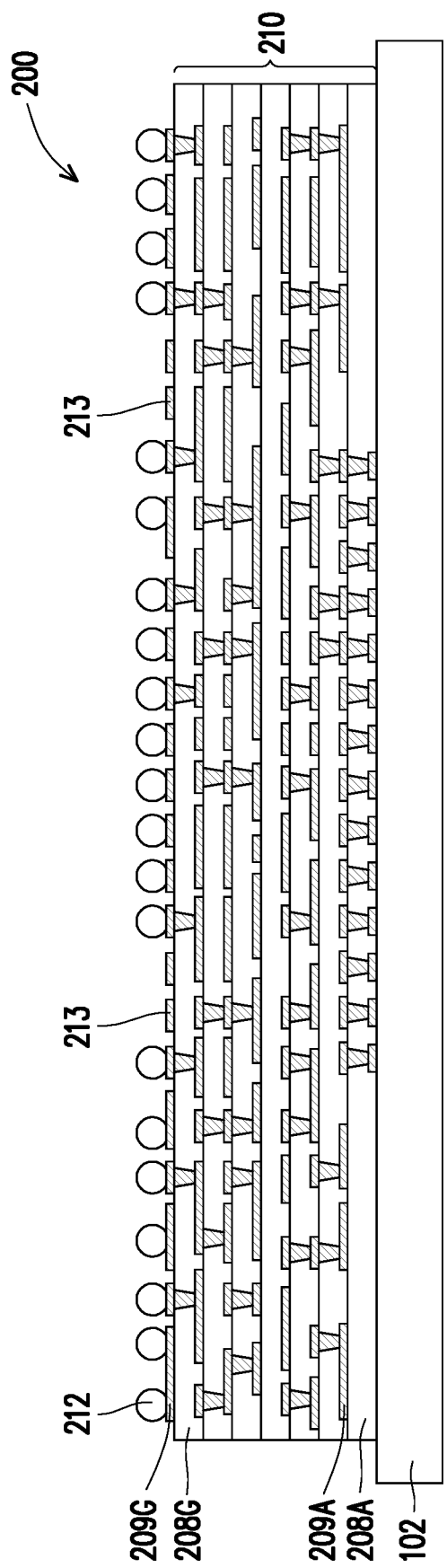

Turning to FIG. 3, external connectors 212 are formed on the redistribution structure 210. In some embodiments, under-bump metallization structures (UBMs, not shown) are first formed on portions of the topmost redistribution layer of the redistribution structure 210 (e.g., redistribution layer 209G in FIG. 2). The UBMs may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the redistribution structure 210. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed. In some embodiments, the UBMs are formed over the topmost redistribution layer as part of formation of the redistribution structure 210, which may include using the same photolithographic steps used to form the topmost redistribution layer. For example, layers of the UBMs may be deposited over the topmost redistribution layer, and then excess material of the topmost redistribution layer and the UBMs removed in the same process.

Still referring to FIG. 3, external connectors 212 are formed over the second redistribution structure 210. The external connectors 212 may be formed over UBMs, if present. The external connectors 212 may be, for example, contact bumps or solder balls, although any suitable types of connectors may be utilized. In an embodiment in which the external connectors 212 are contact bumps, the external connectors 212 may include a material such as tin, or other suitable materials, such as silver, lead-free tin, or copper. In an embodiment in which the external connectors 212 are tin solder bumps, the external connectors 212 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 212. In some embodiments, the external connectors 212 may have a thickness between about 2 µm and about 500 µm. In some embodiments, the external connectors 212 may have a pitch between about 25 µm and about 1250 µm.

Still referring to FIG. 3, some contact regions 213 of the topmost redistribution layer of the redistribution structure 210 remain free of the external connectors 212 after formation of the external connectors 212. The contact regions 213 are regions to which integrated devices 215 (see FIG. 4) are connected. Thus, the contact regions 213 may be contact pads, and in some embodiments may have UBMs formed thereon. The UBMs, if present, may be formed in the same process steps as the UBMs associated with the external connectors 212.

Figure 4:
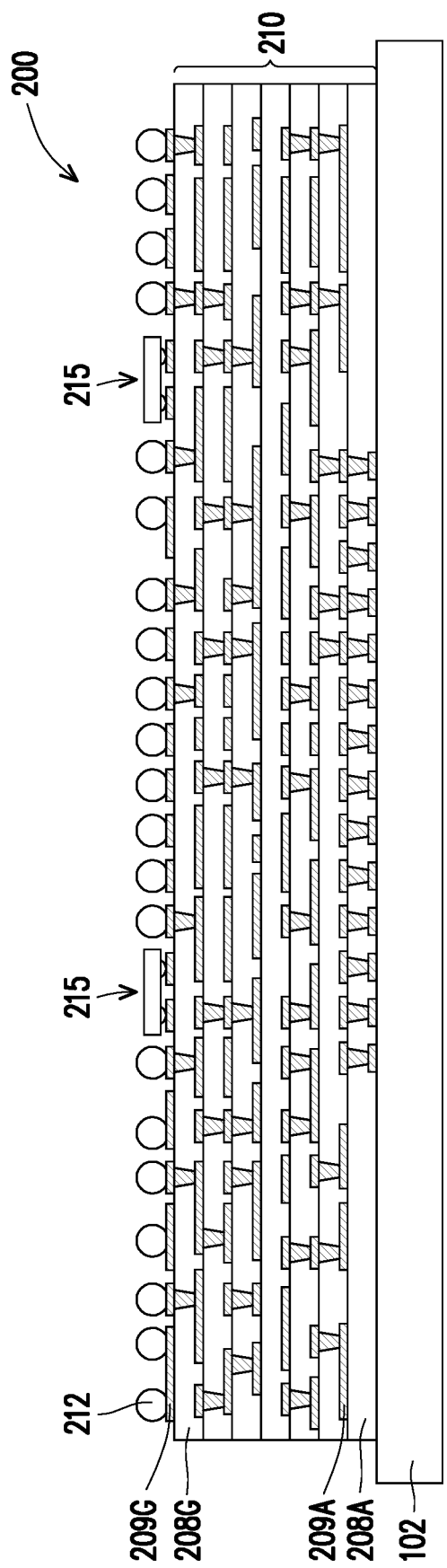

Turning to FIG. 4, one or more integrated devices 215 are attached to the contact regions 213 to make electrical connection with the redistribution structure 210. An integrated device 215 may be placed between neighboring external connectors 212, as shown. FIG. 4 illustrates the placement of two integrated devices 215, but in other embodiments more or fewer integrated devices 215 may be used. The integrated devices 215 may be similar devices or may be different types of devices. In other embodiments, the integrated devices 215 may be attached to the contact regions 213 before formation of the external connectors 212. The integrated devices 215 may be connected to the contact regions 213, for example, by sequentially dipping connectors (e.g., conductive bumps or pads) of the integrated devices 215 such as solder balls (not shown) into flux, and then using a pick-and-place tool in order to physically align the connectors of the integrated devices 215 with corresponding contact regions 213. In some cases, a reflow may be performed to bond the connectors of the integrated devices 215 to the contact regions 213.

The integrated devices 215 may be, for example, a semiconductor device or other device that includes one or more passive devices such as capacitors, resistors, inductors, and the like. The integrated devices 215 may be, for example, integrated passive devices (IPDs). The integrated devices 215 may also include metallization layers that are electrically coupled to passive devices and the like within the integrated devices 215 as desired for a particular functionality. In some embodiments, the integrated devices 215 may be configured to provide voltage or current stabilization for a chip or semiconductor device, such as for semiconductor device 500 (see FIG. 10). In some cases, by attaching the integrated devices 215 to the redistribution structure 210, the routing distance between the integrated devices 215 and a semiconductor device may be reduced, which can reduce inductance and resistance between an integrated device 215 and the semiconductor device. In this manner, a shorter routing distance can improve higher frequency operation of the device and provide improved voltage or current stability. In some embodiments, an integrated device 215 has a thickness between about 20 µm and about 500 µm. In some embodiments, an integrated device 215 has a lateral area between about 2 mm$^2$ and about 500 mm$^2$. An integrated device 215 may have other dimensions than these examples.

Figure 5A:
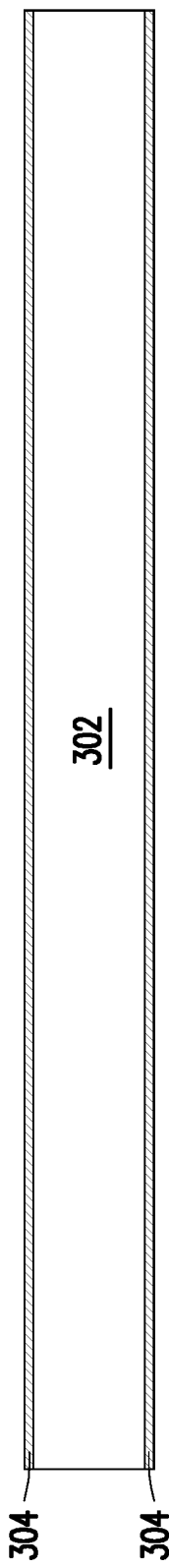
FIGS. 5A through 5C illustrate cross-sectional views of intermediate steps of forming an interconnect structure, in accordance with some embodiments.
Figure 5B:
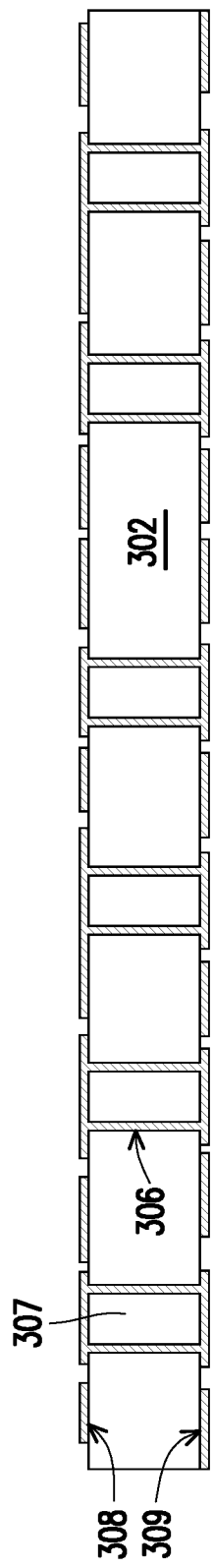
Figure 5C:
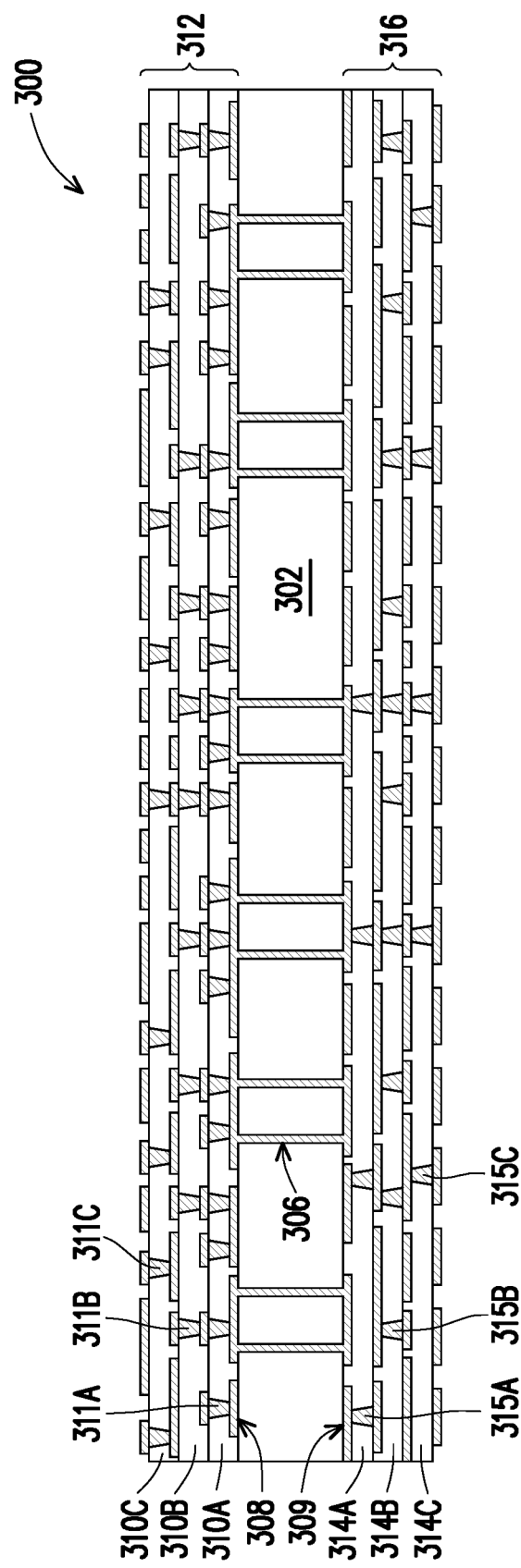

Turning to FIGS. 5A-C, cross-sectional views of intermediate steps of forming an interconnect structure 300 (see FIG. 5C) are shown, in accordance with some embodiments. The interconnect structure 300 is attached to the device structure 200 (see FIGS. 6-7) and provides additional electrical routing. The interconnect structure 300 is free of active devices. In some embodiments, the interconnect structure 300 may be, for example, an interposer or a "semi-finished substrate." The interconnect structure 300 can also provide stability and rigidity to an attached device structure 200, and can reduce warping of an attached device structure 200. FIG. 5A shows a cross-sectional view of a core substrate 302 having conductive layers 304 disposed on opposite surfaces, in accordance with some embodiments. In some embodiments, the core substrate 302 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 302 may have a thickness between about 20 µm and about 2000 µm, such as about 250 µm or about 500 µm. The conductive layers 304 may comprise one or more layers of copper, nickel, aluminum, other conductive materials, the like, or a combination thereof that are laminated or otherwise formed onto opposing sides of the core substrate 302. In some embodiments, the conductive layers 304 may have a thickness between about 10 nm and about 35,000 nm.

Referring to FIG. 5B, openings (not shown) are formed in the core substrate 302 within which through vias 306 are formed (described below). In some embodiments, the openings are formed by, for example, a laser drilling technique. Other processes, e.g., mechanical drilling, etching, or the like, may also be used in other embodiments. In some embodiments, an optional surface preparation process may be performed after the openings are formed. The surface preparation process may include a process that cleans exposed surfaces of the core substrate 302 and conductive layers 304 with one or more cleaning solutions. The cleaning solutions may include sulfuric acid, chromic acid, a neutralizing alkaline solution, a water rinse, the like, or a combination. In some cases, the surface preparation process removes or reduces residues, oils, native oxide films, etc. In some embodiments, an optional desmear process may be performed to clean regions near the openings. The desmear process may be performed in addition to or instead of the surface preparation process. For example, the desmear process may remove residual material of the core substrate 302. The desmear process may be accomplished mechanically (e.g., blasting with a fine abrasive in a wet slurry), chemically (e.g., rinsing with a combination of organic solvents, permanganate etc.), or by a combination of mechanical and chemical desmearing. Following the surface preparation process or desmear process, a conditioning treatment may be performed using a chemical conditioner that facilitates adsorption of an activator used during subsequent electroless plating. In some embodiments, the conditioning treatment may be followed by micro-etching of the conductive layers 304 to roughen the conductive surface for better bonding between the conductive layers 304 and subsequently deposited conductive material for routing layers 308 and 309 (described below).

Still referring to FIG. 5B, conductive material is deposited to form a routing layer 308 on a side of the core substrate 302 and through vias 306 within the openings in the core substrate 302. In some embodiments, the routing layer 308 and through vias 306 are formed by first forming a patterned mask over the core substrate 302. The patterned mask may be, for example, a patterned photoresist layer. Openings in the patterned mask expose portions of the conductive layer 304 on which conductive material will subsequently be formed. The openings in the patterned mask also may expose the openings in the core substrate 302. The conductive material may then be deposited on the exposed regions of the conductive layer 304 and within the openings in the core substrate 302 using, for example, a plating process, an electroless plating process, or another process. In some embodiments, the conductive material is deposited having a thickness between about 1 µm and about 50 µm. After depositing the conductive material, the patterned mask layer (e.g., the photoresist) may be removed using a wet chemical process or a dry process (e.g., an ashing process). Portions of the conductive layer 304 that were covered by the patterned mask layer may be removed with the patterned mask layer or using a separate etching process. In this manner, a routing layer 308 is formed on a side of the core substrate 302. A similar process may then be performed on the opposite side of the core substrate 302 to form a routing layer 309 (and/or remaining portions of through vias 306) on the opposite side of the core substrate 302. In this manner, the conductive material may form routing layers 308 and 309 on opposite sides of the core substrate 302 and through vias 306 extending through the core substrate 302.

In some embodiments, after forming the conductive material along sidewalls of the openings, the openings may then be filled with a dielectric material 307 as illustrated in FIG. 5B. The dielectric material 307 may provide structural support and protection for the conductive material. In some embodiments, the dielectric material 307 may be a material such as a molding material, epoxy, an epoxy molding compound, a resin, the like, or a combination thereof. The dielectric material 307 may be formed using, e.g., a spin-on process or another process. In some embodiments, the conductive material may completely fill the through vias 306, omitting the dielectric material 307.

Turning to FIG. 5C, dielectric layers and additional routing layers may be formed over the routing layers 308 and 309 to form routing structures 312 and 316. The routing structures 312 and 316 are formed on opposite sides of the core substrate 302 and may provide additional electrical routing within the interconnect structure 300. The routing structure 312 is electrically connected to the routing layer 308 and includes alternating dielectric layers 310A-C and routing layers 311A-C. The routing structure 316 is electrically connected to the routing layer 309 and includes alternating dielectric layers 314A-C and routing layers 315A-C. Each of the routing structures 312 or 316 may have any suitable number of dielectric layers or routing layers, including more or fewer than shown in FIG. 5C. In some embodiments, one or both of routing structures 312 or 316 may be omitted. In some embodiments, the number of layers of routing structure 312 may be different than the number of layers of routing structure 316.

In some embodiments, the routing structure 312 is formed by forming a dielectric layer 310A over the routing layer 308 and the core substrate 302. In some embodiments, the dielectric layer 310A may be a material such as a build-up material, ABF, a prepreg material, a laminate material, another material similar to those described above for the core substrate 302, the like, or combinations thereof. The dielectric layer 310A may be formed by a lamination process, a coating process, or another suitable process. In some embodiments, the dielectric layer 310A may have a thickness between about 2 µm and about 50 µm. In some embodiments, a conductive layer (not shown) may be formed over the dielectric layer 310A, which may act as a seed layer for forming conductive material (described below). The conductive layer may be e.g., a metal foil such as a copper foil, or another type of material such as those described above for conductive layer 304. Openings (not shown) are formed in the dielectric layer 310A that expose portions of the routing layer 308 for subsequent electrical connection. In some embodiments, the openings are formed by, for example, a laser drilling technique. Other processes, e.g., mechanical drilling, etching, or the like, may also be used in other embodiments. In some embodiments, an optional surface preparation process (e.g., a desmear process or the like) may be performed after the openings are formed.

A conductive material is then deposited to form routing layer 311A on the dielectric layer 310A and within the openings in the dielectric layer 310A. In some embodiments, the routing layer 311A is formed by first forming a patterned mask over the dielectric layer 310A. The patterned mask may be, for example, a patterned photoresist layer. Openings in the patterned mask may expose portions of the dielectric layer 310A (or, if present, a conductive layer on the dielectric layer 310A) on which conductive material will subsequently be formed. The openings in the patterned mask also may expose the openings in the dielectric layer 310A. The conductive material may then be deposited on the exposed regions of the dielectric layer 310A and within the openings in the dielectric layer 310A using, for example, a plating process, an electroless plating process, or another process. In some embodiments, the conductive material is deposited having a thickness between about 1 µm and about 50 µm. After depositing the conductive material, the patterned mask layer (e.g., the photoresist) may be removed using a wet chemical process or a dry process (e.g., an ashing process). In this manner, an additional routing layer 311A is formed over and electrically connected to the routing layer 308.

Additional dielectric layers 310B-C and routing layers 311B-C may then be formed over the routing layer 311A and dielectric layer 310A to provide additional routing along with electrical connection within the routing structure 312. The dielectric layers 310B-C and routing layers 311B-C may be formed in alternating layers, and may be formed using processes and materials similar to those used for the dielectric layer 310A or the routing layer 311A. For example, a dielectric layer (e.g., dielectric layer 310B) may be formed over a routing layer (e.g., routing layer 311A), and then openings made through the dielectric layer to expose portions of the underlying routing layer using, e.g., a laser drilling process. A patterned mask may be formed over the dielectric layer, and conductive material may then be formed and the patterned mask removed, forming a routing layer over the dielectric layer. These steps may be repeated to form a routing structure 312 having a suitable number and configuration of dielectric layers and routing layers.

In some embodiments, dielectric layers 314A-C and routing layers 315A-C may be formed over the routing layer 309 to form the routing structure 316. The routing structure 316 may be formed using a process similar to that of the routing structure 312, described above. For example, dielectric layers 314A-C may be formed alternating with routing layers 315A-C. Openings in a dielectric layer may be formed (e.g., using laser drilling) and conductive material deposited over the dielectric layer to form a routing layer. These steps may be repeated to form a routing structure 316 having a suitable number and configuration of dielectric layers and routing layers. The routing structure 316 may be electrically connected to the routing structure 312 by the through vias 306.

In some embodiments, a patterned protective layer (not shown) is formed over the routing structures 312 and 316 of the interconnect structure 300. The protective layer may be e.g., a solder resist material, and may be formed to protect the surfaces of the routing structures 312 or 316. In some embodiments, the protective layer may be a photosensitive material formed by printing, lamination, spin-coating, or the like. The photosensitive material may then be exposed to an optical pattern and developed, forming openings in the photosensitive material. In other embodiments, the protective layer may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protective layer may be formed and patterned over the routing structure 312 and the routing structure 316 using the same techniques. Other processes and materials may also be used.

In some embodiments, an optional solderability treatment may then be performed on the exposed surfaces of the topmost routing layers of the routing structures 312 or 316. For example, as shown in FIG. 5C, a solderability treatment may be performed on exposed surfaces of the routing layer 311C and on exposed surfaces of the routing layer 315C. The treatment may include an electroless nickel—electroless palladium-immersion gold technique (ENEPIG) process, an organic solderability preservative (OSP) process, or the like. In some embodiments, external connectors (not shown) such as solder bumps may be formed on one or both of the routing structures 312 or 316. The external connectors may, for example, be similar to external connectors 212 (see FIG. 4) or may be similar to external connectors 406, described below with respect to FIG. 10. In some embodiments, the interconnect structure 300 is manufactured in a different facility the device structure 200.

Figure 6:
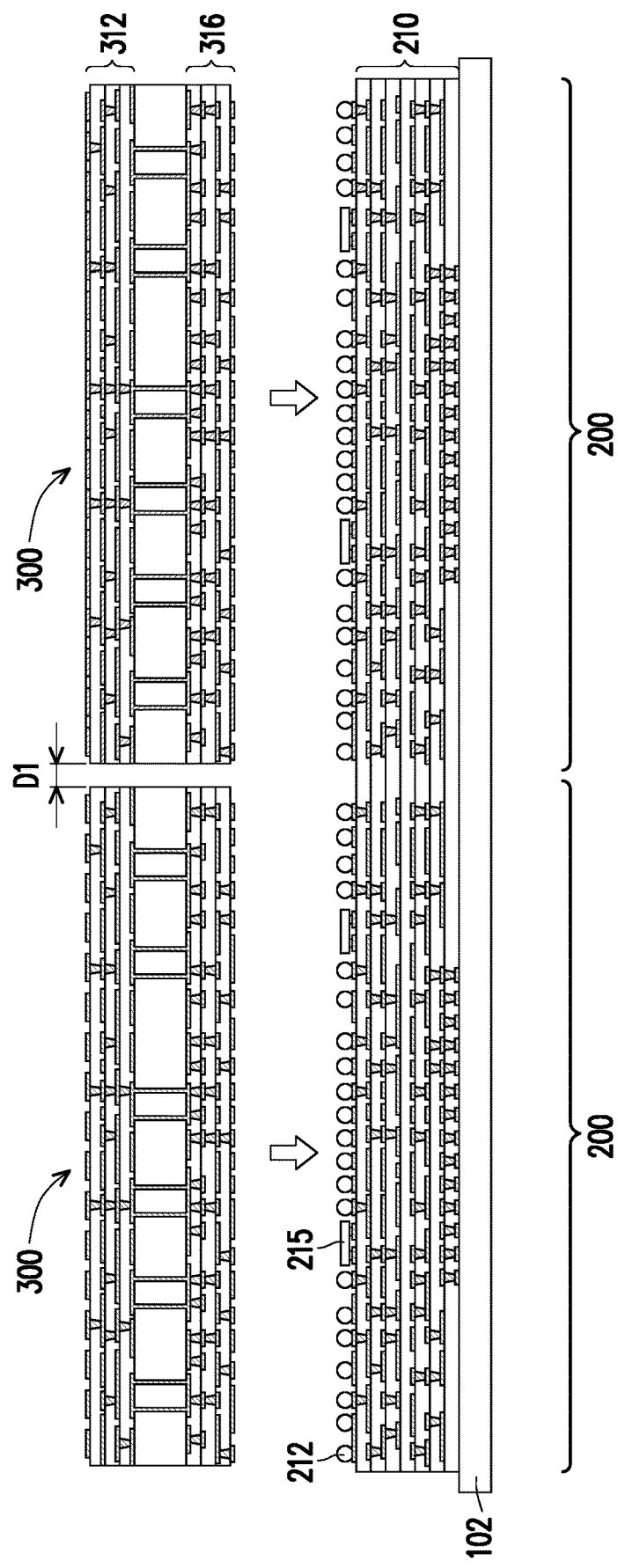
FIGS. 6 through 11 illustrate cross-sectional views of intermediate steps of forming a package, in accordance with some embodiments.

FIG. 6 illustrates a placement of interconnect structures 300 into electrical connection with device structures 200, in accordance with some embodiments. FIG. 6 shows an embodiment in which multiple, distinct interconnect structures 300 are to be bonded to multiple device structures 200 prior to singulating the multiple device structures 200. In an embodiment, the interconnect structures 300 are placed into physical contact with the external connectors 212 (on the device structures 200) using, e.g., a pick and place process. The interconnect structures 300 may be placed such that exposed regions of a topmost routing layer are aligned with corresponding external connectors 212. For example, the regions of the routing layer 311C (see FIG. 5C) of the routing structure 312 or regions of the routing layer 315C of the routing structure 316 (see FIG. 5C) may be placed in physical contact with the external connectors 212. Once in physical contact, a reflow process may be utilized to bond the external connectors 212 of the device structures 200 to the interconnect structures 300. In some embodiments, external connectors are formed on the interconnect structures 300 instead of or in addition to the external connectors 212 formed on the device structure 200.

In the embodiment shown in FIG. 6, the device structures 200 are shown prior to singulation. In other embodiments, the device structures 200 may be singulated prior to attachment of the interconnect structures 300. As shown in FIG. 6, adjacent interconnect structures 300 may be placed such that a gap Di is present between them. In some embodiments, the spacing of adjacent device structures 200 may be controlled such that the gap Di is a certain distance or within a certain range of distances. For example, the gap Di may be a distance between about 10 µm and about 5000 µm. In some cases, the gap Di distance may be controlled in order to avoid collision between adjacent interconnect structures 300 during placement. In some cases, the gap Di distance may be controlled to facilitate subsequent deposition of molding underfill 402, described below with respect to FIG. 7.

Figure 7:
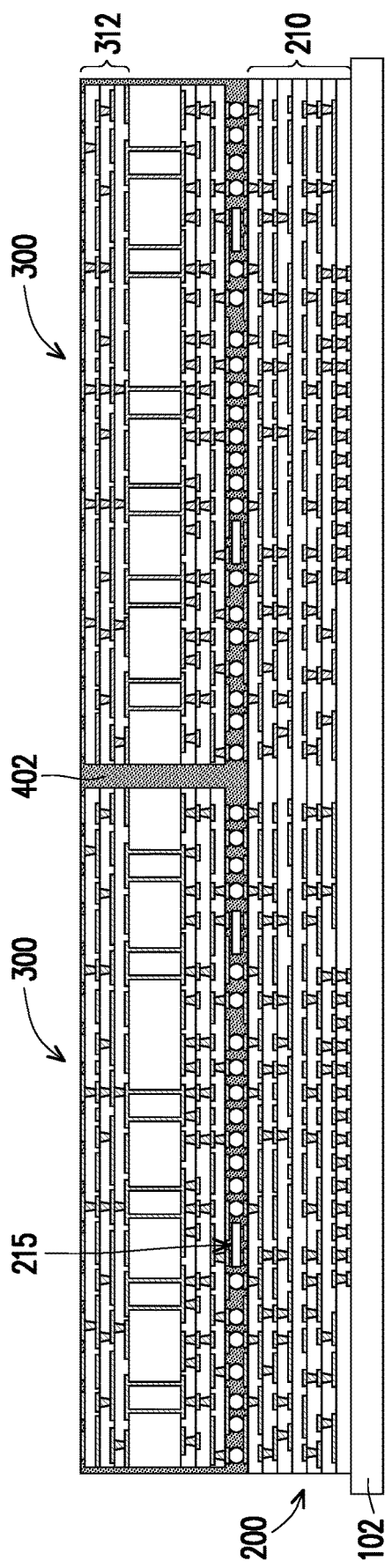

FIG. 7 shows interconnect structures 300 attached to device structures 200, in accordance with some embodiments. As shown in FIG. 7, the integrated devices 215 are located in the gap between an interconnect structure 300 and its corresponding device structure 200. In this manner, the integrated devices 215 may be incorporated within a structure (e.g., package 600 of FIG. 11) without increasing the overall thickness of the structure. In some embodiments, the vertical distance between the bottom dielectric layer of the interconnect structure 300 and the top insulating layer of the device structure 200 is between about 20 µm and about 5000 µm. In FIG. 7, an underfill 402 is deposited along the sidewalls of the interconnect structure 300 and in the gap between the interconnect structure 300 and the device structure 200. The underfill 402 may also at least partially surround some external connectors 212 or some integrated devices 215. In some embodiments, portions of the underfill 402 extend between the integrated devices 215 and the interconnect structure 300. The underfill 402 may be a material such as a molding compound, an epoxy, an underfill, a molding underfill (MUF), a resin, or the like. The underfill 402 can protect the external connectors 212 and integrated devices 215 and can provide structural support for the device structure. In some embodiments, the underfill 402 may be cured after deposition. In some embodiments, the underfill 402 may be thinned after deposition. The thinning may be performed, e.g., using a mechanical grinding or CMP process. In some embodiments, the underfill 402 may be deposited over the routing structure 312, and the thinning may expose the topmost routing layer of the routing structure 312 (e.g., routing layer 311C).

Figure 8:
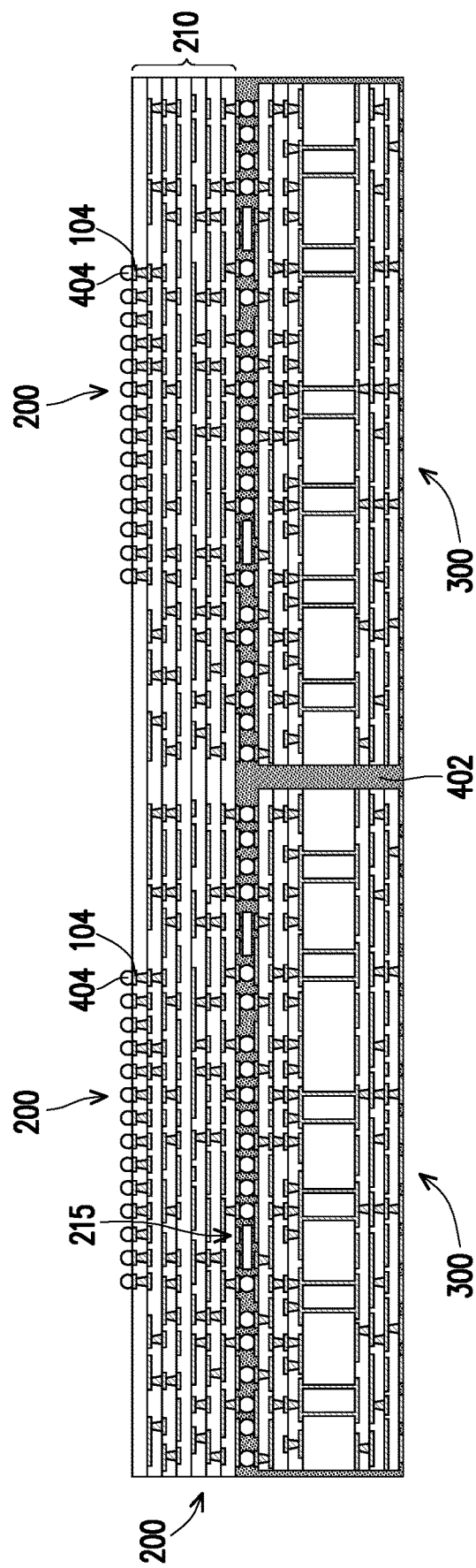

FIG. 8 illustrates a debonding of the carrier substrate 102 and formation of conductive connectors 404 on the contact pads 104 of the device structure 200, in accordance with some embodiments. The carrier substrate 202 may be debonded from the device structure 200 using, e.g., a thermal process to alter the adhesive properties of a release layer disposed on the carrier substrate 202. In a particular embodiment an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier substrate 102 and the release layer may be physically separated and removed from the device structure 200. In some embodiments, the structure may be flipped over, and the interconnect structures 300 may be attached to a temporary substrate (not shown), such as a tape, wafer, panel, frame, ring, or the like.

In FIG. 8, conductive connectors 404 are formed over and electrically connected to contact pads 104 of the device structure 200. In some embodiments, UBMs are formed on the contact pads 104, and the conductive connectors 404 are formed over the UBMs. In some embodiments, a protective layer (not shown) is first formed over the routing structure 210. The protective layer may be formed over UBMs, if present. The protective layer may be formed from one or more suitable dielectric materials such as polybenzoxazole (PBO), a polymer material, a polyimide material, a polyimide derivative, an oxide, a nitride, the like, or a combination thereof. The protective layer may be formed by a process such as spin-coating, lamination, CVD, the like, or a combination thereof. Openings may then be formed in the protective layer to expose the contact pads 104 (which may include UBMs, if present). The openings in the protective layer may be formed using a suitable technique such as laser drilling or a photolithographic mask and etching process. The conductive connectors 404 are then formed over the contact pads 104, and make electrical connection to the routing structure 210.

The conductive connectors 404 may be, for example, contact bumps or solder balls (e.g., C4 balls), although any suitable type of connectors may be utilized. In an embodiment in which the conductive connectors 404 are contact bumps, the conductive connectors 404 may include a material such as tin, or other suitable materials, such as silver, lead-free tin, or copper. In an embodiment in which the conductive connectors 404 are tin solder bumps, the conductive connectors 404 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the conductive connectors 404. In some embodiments, the conductive connectors 404 may be similar to external connectors 212 described above with respect to FIG. 3.

Figure 9:
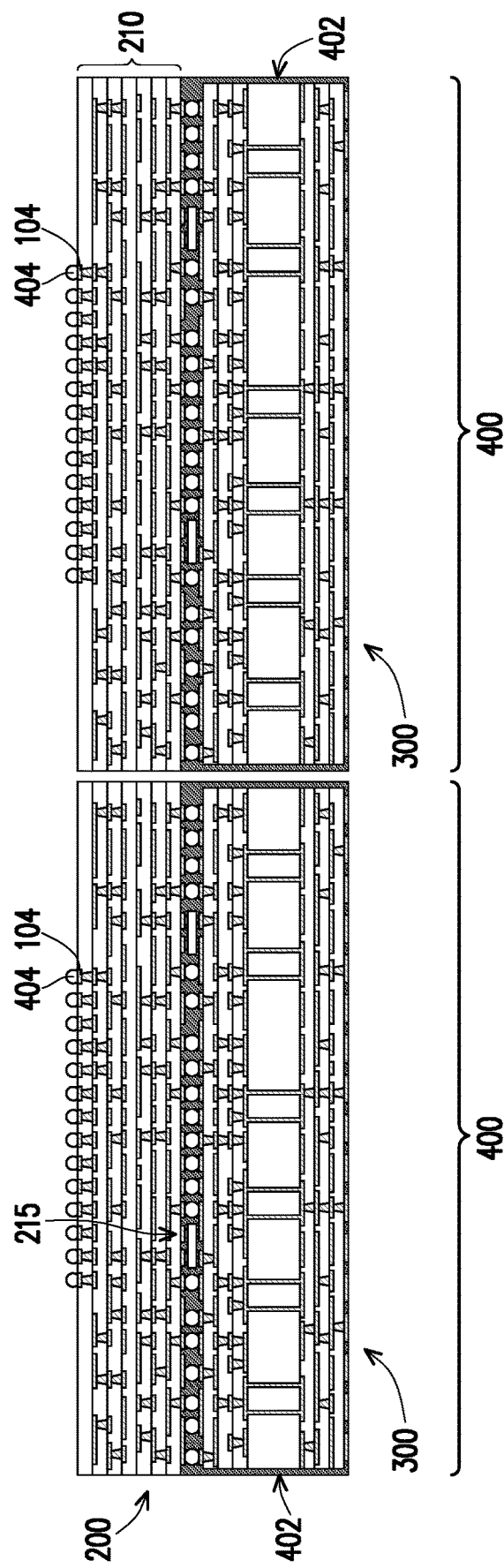

FIG. 9 illustrates a singulation of the structure to form package structure 400, in accordance with some embodiments. In an embodiment, the structure may be singulated using one or more saw blades that separate the structure into discrete pieces, forming one or more singulated package structures 400. However, any suitable method of singulation, including laser ablation or one or more wet etches, may also be utilized. After singulation, the package structure 400 may be removed from the temporary substrate. In some embodiments, the package structure 400 may have lateral dimensions between about 20 mm by 20 mm and about 500 mm by 500 mm, such as about 100 mm by 100 mm, though a package structure 400 may have other dimensions than these. In some embodiments, the package structure 400 may have a vertical thickness between about 20 μm and about 5000 μm.

Still referring to FIG. 9, each package structure 400 includes a device structure 200 and an interconnect structure 300. In the embodiment shown in FIG. 9, the device structure 200 has larger lateral dimensions than the interconnect structure 300. Because the device structure 200 is wider than the interconnect structure 300, portions of the underfill 402 may remain on one or more sidewalls of the interconnect structure 300 after singulation, as shown. In some embodiments, the underfill 402 may have one or more sidewalls that are planar with sidewalls of the device structure 200. In some embodiments, the lateral width of the interconnect structure 300 may be between about 50% and about 100% of the lateral width of the device structure 200. In some embodiments, the lateral width of the interconnect structure 300 may be between about 10 mm and about 500 mm. In some embodiments, the lateral width of the device structure 200 may be between about 20 mm and about 500 mm. In other embodiments, the singulation process removes underfill 402 from the sidewalls of the interconnect structures 300, such that the sidewalls of the interconnect structures 300 are exposed (not shown).

Forming a package structure 400 that includes an interconnect structure 300 attached to a device structure 200 as described herein may achieve advantages. For example, a structure having larger lateral dimensions may be more prone to warping or delamination. An interconnect structure 300 as described herein may be relatively rigid and thus may provide structural support for the device structure 200, reducing warping of the device structure 200. Additionally, the underfill 402 remaining on the sidewalls of an interconnect structure 300 can provide additional protection and structural support to the interconnect structure 300.

Figure 10:
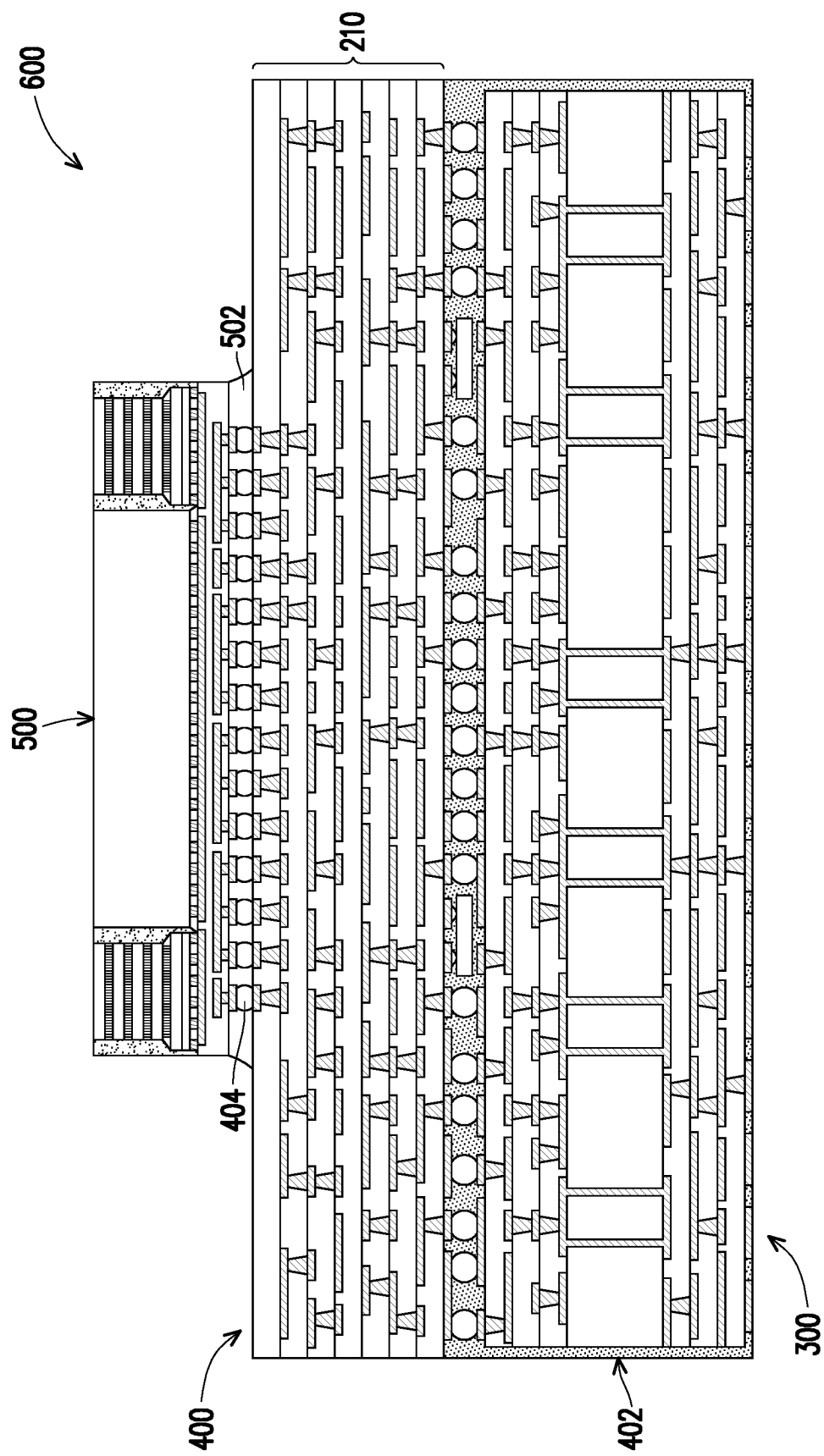

FIG. 10 illustrates the attachment of a semiconductor device 500 to the conductive connectors 404, making electrical connection between the semiconductor device 500 and the redistribution structure 210. The semiconductor device 500 may be placed on the conductive connectors 404 using a suitable process such as a pick-and-place process. The semiconductor device 500 may include one or more devices, which may include devices designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), an integrated fan-out structure (InFO), a package, the like, or a combination thereof. In an embodiment, the semiconductor device 500 includes integrated circuit devices, such as transistors, capacitors, inductors, resistors, metallization layers, external connectors, and the like, therein, as desired for a particular functionality. In some embodiments, the semiconductor device 500 may include more than one of the same type of device, or may include different devices. FIG. 10 shows a single semiconductor device 500, but in other embodiments one, two, or more than three semiconductor devices 500 may be attached to the conductive connectors 404.

The semiconductor device 500 may be placed such that conductive regions of the semiconductor device (e.g., contact pads) are aligned with corresponding conductive connectors 404. Once in physical contact, a reflow process may be utilized to bond the conductive connectors 404 of the device structure 200 to the semiconductor device 500. In some embodiments, external connectors are formed on the semiconductor device 500 instead of or in addition to the conductive connectors 404 formed on the device structure 200. In some embodiments, the conductive connectors 404 are not formed on the device structures 200, and the semiconductor device 500 is bonded to the device structures 200 using a direct bonding technique such as a thermocompression bonding technique. As shown in FIG. 10, an underfill 502 may be deposited along the sidewalls of the gap between the semiconductor device 500 and the device structure 200. The underfill 502 may also at least partially surround some conductive connectors 404. The underfill 502 may be a material such as a molding compound, an epoxy, an underfill, a molding underfill (MUF), a resin, or the like, and may be similar to underfill 402 described previously.

Figure 11:
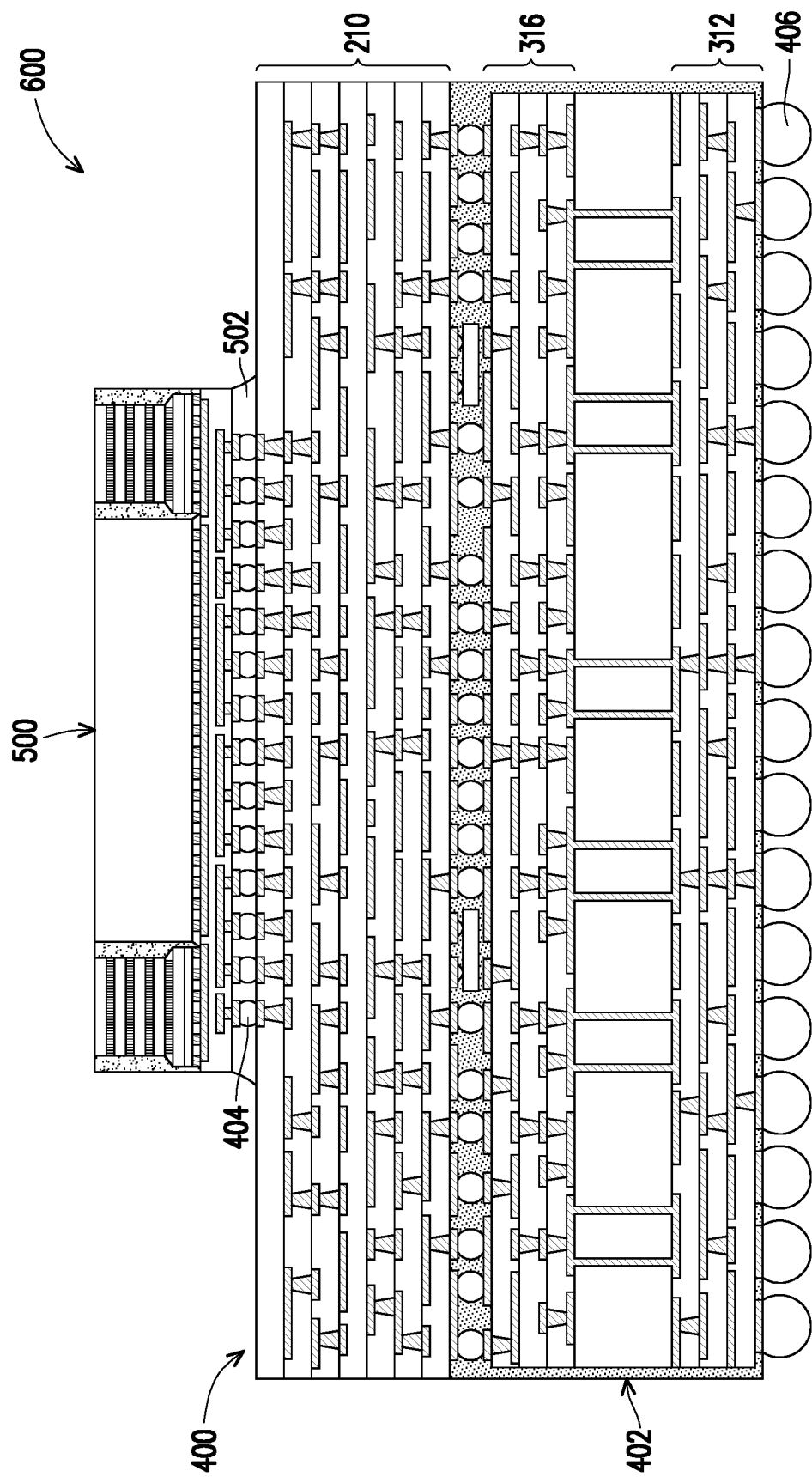

In FIG. 11, external connectors 406 are formed over and electrically connected to the interconnect structure 300, forming a package 600. The external connectors 406 may be formed on exposed portions of the topmost routing layer of the routing structure 312 (e.g., routing layer 311C). In some embodiments, UBMs are formed on the routing structure 312, and the external connectors 406 are formed over the UBMs. In some embodiments a protective layer (not shown) is first formed over the routing structure 312. The protective layer may be formed over UBMs, if present. The protective layer may be similar to the protective layer described previously with respect to FIG. 8, and may be formed in a similar manner. Openings may be formed in the protective layer to expose portions of the routing structure 312 (which may include UBMs, if present).

The external connectors 406 are then formed over the exposed portions of the routing structure 312, and make electrical connection to the routing structure 312. The external connectors 406 may be, for example, contact bumps or solder balls, although any suitable types of connectors may be utilized. In an embodiment in which the external connectors 406 are contact bumps, the external connectors 406 may include a material such as tin, or other suitable materials, such as silver, lead-free tin, or copper. In an embodiment in which the external connectors 406 are tin solder bumps, the external connectors 406 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 406. In some embodiments, the external connectors 406 may have a thickness between about 2 μm and about 1000 μm. In some embodiments, the external connectors 406 may have a pitch between about 25 μm and about 1500 μm. In some embodiments, the external connectors 406 may be similar to external connectors 212 described above with respect to FIG. 3.

By forming a package 600 in which the integrated devices 215 are disposed in the gap between the redistribution structure 210 and the interconnect structure 300, the electrical performance of the package 600 may be improved. For example, the distance between the integrated device 215 and the semiconductor device 500 may be reduced, which can reduce routing distance and thus reduce resistance or inductance between the integrated device 215 and the semiconductor device 500. For example, by reducing the distance in this manner, voltage drops due to resistance can also be reduced. In some cases, the distance between a semiconductor device 500 and an integrated device 215 mounted on the opposite side of the redistribution structure 210 (as shown in Figure ii) may be less than the distance between a semiconductor device and an integrated device mounted adjacent the semiconductor device, on the same side of the redistribution structure. The distance between an integrated device 215 and a semiconductor device 500 may also be less than the distance between a semiconductor device and an integrated device mounted within an interconnect structure or on the opposite side of an interconnect structure. In some embodiments, the vertical distance between an integrated device 215 and a semiconductor device 500 may be less than about 10 mm, such as a distance less than about 0.3 mm. In some cases, by mounting the integrated device 215 between the redistribution structure 210 and the interconnect structure 300 as described herein, the equivalent self-inductance between the integrated device 215 and the semiconductor device 500 may be reduced by more than about 85%, such as more than about 99%. By reducing the inductance, the high frequency performance of the package 600 may be improved. For example, the available frequency of operation of the package may be increased by as much as about 300%. In some cases, the available frequency of operation may be increased to a frequency of about 600 MHz or greater. Additionally, the power integrity of the package 600 may be improved due to more stable electrical performance.

In some cases, the redistribution structure 210 may be formed using more robust and reliable techniques than the routing structures 312 or 316. For example, the redistribution structure 210 may be formed (e.g., in a semiconductor fabrication plant) using a fan-out process, whereas the routing structures 312 and 316 may be formed using a build-up process. By using a more robust process, the redistribution structures 210 may have higher a yield than the routing structures 312 and 316. In some cases, the process for forming the redistribution structure 210 may form redistribution layers having smaller dimensions and having less line width roughness than the process for forming routing layers in the routing structures 312 and 316. Thus, the redistribution structure 210 may have improved electrical performance relative to the routing structures 312 and 316, particularly in the case of high frequency operation.

In some cases, by forming the redistribution structure 210 as part of the device structure 200, the routing structures 312 or 316 of the interconnect structure 300 may be formed having fewer layers. By forming more of the electrical routing of the package 600 within the redistribution structure 210 and less of the electrical routing within the routing structures 312 or 316, the overall electrical performance of the package 400 may be improved, as described previously. The redistribution structures 110 and 210 may have individual layers that are thinner than the individual layers of the routing structures 312 and 316, which can reduce overall size of the package 600. Additionally, the overall manufacturing cost of the package 600 may be reduced by forming more layers within the redistribution structures 210.

In some cases, materials of a package or device having large differences of the coefficient of thermal expansion (CTE) can cause delamination, shorts, or other failures at higher temperature operation. In some cases, the redistribution structure 210 may include materials having a CTE that is closer to the CTE of semiconductor device 500 (or other materials in the package 600) than the CTE of materials of the interconnect structure 300. For example, the insulation layers of the redistribution structure 210 may have a CTE that is smaller than the CTE of the dielectric layers of the routing structures 312 or 316. Thus, by forming more of the electrical routing in the device structure 200 and forming less of the electrical routing in the interconnect structure 300, the reliability of the package 600 may be improved, particularly at higher temperature operation.

In an embodiment, a method includes forming a redistribution structure on a carrier, attaching an integrated passive device on a first side of the redistribution structure, attaching an interconnect structure to the first side of the redistribution structure, the integrated passive device interposed between the redistribution structure and the interconnect structure, depositing an underfill material between the interconnect structure and the redistribution structure, and attaching a semiconductor device on a second side of the redistribution structure that is opposite the first side of the redistribution structure. In an embodiment, the interconnect structure includes a core substrate. In an embodiment, the underfill material covers sidewalls of the interconnect structure. In an embodiment, the underfill material covering the sidewalls of the interconnect structure are coplanar with the sidewalls of the redistribution structure. In an embodiment, attaching the interconnect structure to the redistribution structure includes forming multiple solder bumps on the redistribution structure, and placing the interconnect structure on the multiple solder bumps. In an embodiment, the method further includes, after attaching the integrated passive device and the interconnect structure, performing a reflow process on the integrated passive device and the interconnect structure. In an embodiment, wherein the integrated passive device is disposed directly between the semiconductor device and the interconnect structure in a vertical direction. In an embodiment, wherein forming the redistribution structure includes depositing a polymer layer over the carrier, patterning openings in the polymer layer, forming a patterned mask over the polymer layer, and depositing conductive material over the polymer layer, using the patterned mask.

In an embodiment, a method includes forming first contact pads on a carrier substrate, forming a redistribution structure on the first contact pads, forming second contact pads on the redistribution structure, electrically connecting an integrated passive device to a first set of the second contact pads, electrically connecting an interconnect structure to a second set of the second contact pads using conductive connectors, and electrically connecting a semiconductor die to the first contact pads. In an embodiment, the integrated passive device is laterally disposed between two conductive connectors. In an embodiment, the integrated passive device is disposed in a gap between the redistribution structure and the interconnect structure. In an embodiment, the method further includes, after electrically connecting the interconnect structure to the second set of the second contact pads, depositing a molding material between the interconnect structure and the redistribution structure. In an embodiment, the method further includes performing a singulation process on the redistribution structure, wherein underfill material remains on the sidewalls of the interconnect structure after performing the singulation process. In an embodiment, the redistribution structure has a first lateral width and the interconnect structure has a second lateral width, wherein the first lateral width is greater than the second lateral width. In an embodiment, the method further includes forming the interconnect structure, wherein forming the interconnect structure includes forming first multiple conductive traces over a first side of a core substrate, forming second multiple conductive traces over a second side of the core substrate, and forming multiple through vias extending through the core substrate, the through vias electrically connected to the first multiple conductive traces and to the second multiple conductive traces.

In an embodiment, a package comprises an interconnect structure, a redistribution structure electrically connected to the interconnect structure, at least one integrated device in a gap between the redistribution structure and the interconnect structure, the at least one integrated device electrically connected to the interconnect structure, an underfill material in the gap between the redistribution structure and the interconnect structure, the underfill material extending from the redistribution structure to the interconnect structure and at least laterally surrounding the at least one integrated device, and at least one semiconductor device on a side of the redistribution structure opposite the integrated device, the at least one semiconductor device electrically connected to the redistribution structure. In an embodiment, a distance between at least one integrated device and at least one semiconductor device is less than 0.3 mm. In an embodiment, the interconnect structure includes a core substrate. In an embodiment, the underfill material extends along sidewalls of the interconnect structure. In an embodiment, the underfill material extends between the at least one integrated device and the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   an interconnect structure, the interconnect structure comprising a core substrate;
   a redistribution structure electrically connected to the interconnect structure using first solder joints;
   at least one integrated device attached to a first side of the redistribution structure, wherein the at least one integrated device is between the core substrate and the redistribution structure;
   a first underfill material extending along sidewalls of the at least one integrated device; and
   at least one semiconductor device on a second side of the redistribution structure, the at least one semiconductor device electrically connected to the redistribution structure.

2. The package of claim 1, wherein a sidewall of the first underfill material and sidewall of the redistribution structure are coterminous.

3. The package of claim 1, wherein the at least one semiconductor device is attached to the second side of the redistribution structure using second solder joints.

4. The package of claim 1, further comprising a second underfill material between the at least one semiconductor device and the redistribution structure.

5. The package of claim 1, wherein the first underfill material extends between the at least one integrated device and the interconnect structure.

6. The package of claim 1, wherein the at least one integrated device comprises an integrated passive device.

7. The package of claim 1, wherein the first underfill material extends between the at least one integrated device and the redistribution structure.

8. A package, comprising:
   a redistribution structure, the redistribution structure comprising a plurality of first layers of conductive routing lines;
   an integrated device attached to a first side of the redistribution structure using solder;
   an interconnect structure attached to the first side of the redistribution structure using solder, the interconnect structure comprising a core substrate and a plurality of second layers of conductive routing lines, wherein the integrated device is between the redistribution structure and the core substrate;
   an insulating material between the redistribution structure and the interconnect structure, wherein the insulating material extends along sidewalls of the integrated device and sidewalls of core substrate; and
   a semiconductor package attached to a second side of the redistribution structure.

9. The package of claim 8, wherein sidewalls of the redistribution structure are free of the insulating material.

10. The package of claim 8, further comprising an underfill between the semiconductor package and the redistribution structure.

11. The package of claim 8, wherein the plurality of first layers of conductive routing lines comprises a first conductive line and a first conductive via, wherein the first conductive via has a first width at a first distance from the interconnect structure and a second width at a second distance from the interconnect structure, wherein the first distance is less than the second distance, wherein the first width is greater than the second width.

12. The package of claim 8, wherein a distance between the integrated device and the semiconductor package is less than 0.3 mm.

13. The package of claim 8, wherein a width of the insulating material is equal to a width of the redistribution structure in a cross-sectional view.

14. The package of claim 8, wherein the insulating material contacts a surface of the interconnect structure opposite the redistribution structure.

15. A method of forming a semiconductor package, the method comprising:
   forming a redistribution structure on a carrier;
   attaching an integrated passive device to the redistribution structure;
   attaching an interconnect structure to the redistribution structure using solder joints, the integrated passive device being between two of the solder joints;
   after attaching the interconnect structure, removing the carrier; and
   attaching a semiconductor device to the redistribution structure, wherein the redistribution structure is between the semiconductor device and the integrated passive device.

16. The method of claim 15, further comprising forming an insulating material along sidewalls of the interconnect structure.

17. The method of claim 16, further comprising, after attaching the interconnect structure, singulating through the redistribution structure and the insulating material.

18. The method of claim 17, wherein, after singulating, a portion of the insulating material remains along sidewalls of the interconnect structure.

19. The method of claim 17, wherein singulating is performed prior to attaching the semiconductor device.

20. The method of claim 15, wherein a distance between the integrated passive device and the semiconductor device is less than 0.3 mm.

* * * * *